(12) United States Patent
Niimi

(10) Patent No.: US 8,811,107 B2
(45) Date of Patent: *Aug. 19, 2014

(54) STORAGE DEVICE, CONTROL METHOD OF STORAGE DEVICE, AND CONTROL METHOD OF STORAGE CONTROL DEVICE

(71) Applicant: Spansion LLC, Sunnyvale, CA (US)

(72) Inventor: Masahiro Niimi, Aichiken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/725,749

(22) Filed: Dec. 21, 2012

(65) Prior Publication Data

US 2013/0107644 A1 May 2, 2013

Related U.S. Application Data

(62) Division of application No. 11/510,061, filed on Aug. 25, 2006, now Pat. No. 8,395,959.

(30) Foreign Application Priority Data

Aug. 25, 2005 (WO) .................. PCT/JP2005/015415

(51) Int. Cl.
*G11C 8/12* (2006.01)

(52) U.S. Cl.
USPC ................................ 365/230.03; 365/185.11

(58) Field of Classification Search
CPC ............ G11C 8/06; G11C 8/12; G11C 16/08; G11C 16/16
USPC .................. 365/185.29, 185.11, 218, 230.06, 365/230.03
See application file for complete search history.

(56) References Cited

U.S. PATENT DOCUMENTS

| | | | |
|---|---|---|---|
| 5,818,754 A | 10/1998 | Ogura | |
| 6,363,008 B1 | 3/2002 | Wong | |
| 6,377,502 B1 | 4/2002 | Honda et al. | |
| 6,425,062 B1 | 7/2002 | Kendall et al. | |
| 6,552,936 B2 | 4/2003 | Shiga et al. | |
| 6,691,204 B1 | 2/2004 | Roohparvar | |
| 6,803,265 B1 | 10/2004 | Ngo et al. | |
| 6,851,026 B1 | 2/2005 | Roohparvar | |
| 6,906,960 B2 | 6/2005 | Saito et al. | |
| 7,042,795 B2 | 5/2006 | Lee et al. | |
| 7,046,559 B2 | 5/2006 | Saito | |
| 2003/0064564 A1 | 4/2003 | Lin | |
| 2006/0250870 A1 | 11/2006 | Cho | |

FOREIGN PATENT DOCUMENTS

JP          08-180692          12/1996

*Primary Examiner* — Douglas King

(57) ABSTRACT

Memory cell regions as units of erasing operation are sectors S, and units of reading operation and/or writing operation are blocks B0 to B3 in a sector, in which a block address BA for selecting one of blocks B0 to B3 is held in block address buffer (BAB) 3. Holding operation is executed prior to reading or writing operation, and hence in subsequent reading operation or writing operation, re-input is not needed. Depending on the held block address BA, any one of selection signals YDn (n=0 to 3) is selected, and any one block is selected depending on the selection signal YDn. This state is maintained until the block address BA held in the block address buffer (BAB) 3 is rewritten, and therefore it is not required to enter or decode the block address BA on every occasion of reading and/or writing operation, so that the access operation can be executed promptly and at low current consumption.

5 Claims, 8 Drawing Sheets

| BUS CYCLE | FIRST CYCLE | | SECOND CYCLE | | THIRD CYCLE | |
|---|---|---|---|---|---|---|
| TERMINAL | ADDRESS (ADD) | DATA (IO) | ADDRESS (ADD) | DATA (IO) | ADDRESS (ADD) | DATA (IO) |
| ENTRY COMMAND | 555h | AAh | 2AAh | 55h | 555h | 93h |
| WRITE COMMEND | XXh | A0h | 00h | BAin | | |
| EXIT COMMAND | XXh | 90h | XXh | 00h | | |

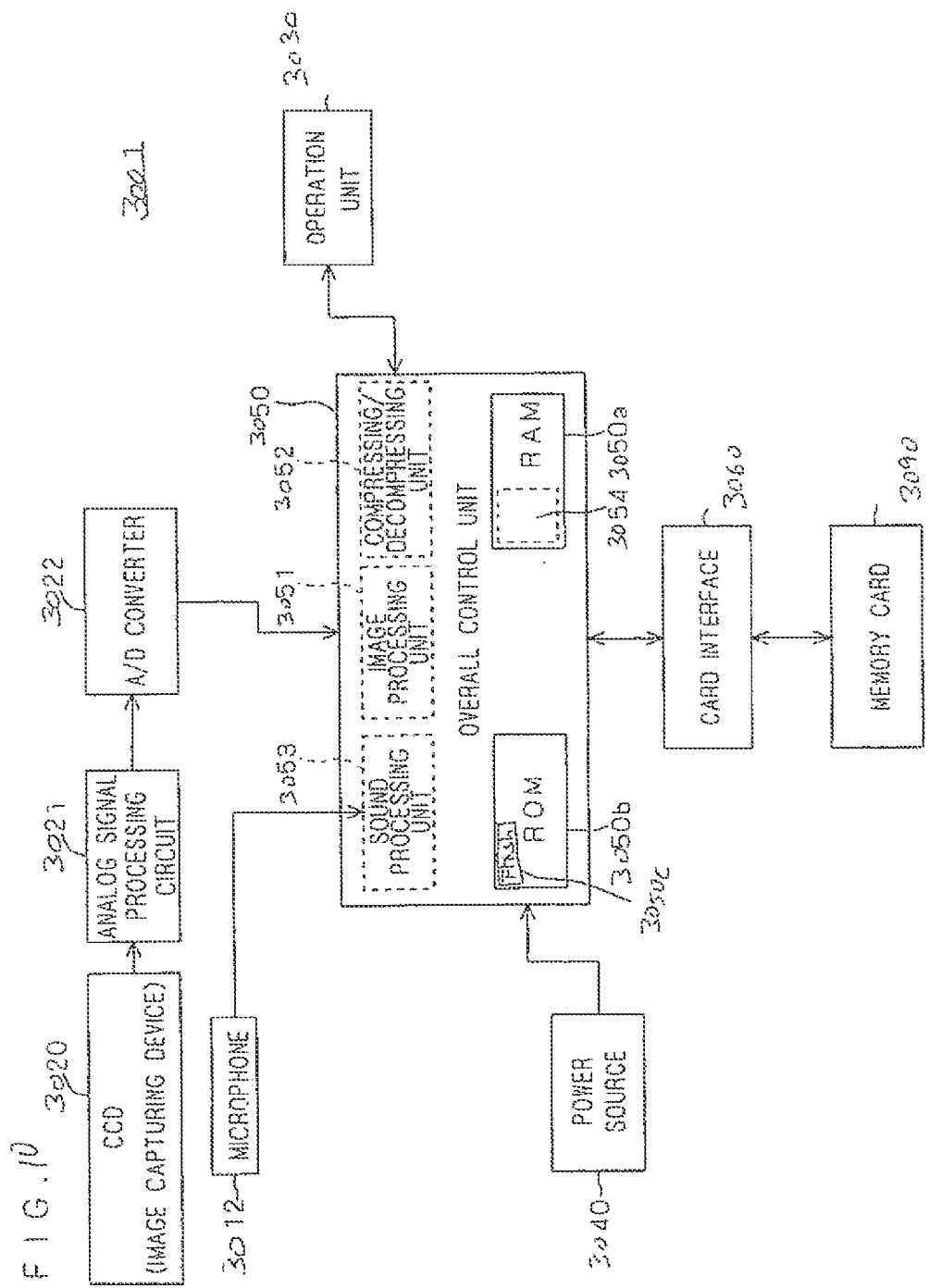

STORAGE DEVICE, CONTROL METHOD OF STORAGE DEVICE, AND CONTROL METHOD OF STORAGE CONTROL DEVICE

CROSS-REFERENCE TO RELATED APPLICATIONS

This application is a divisional of U.S. patent application Ser. No. 11/510,061, filed on Aug. 25, 2006, entitled "Storage Device, Control Method of Storage Device, and Control Method of Storage Control Device," which is a continuation-in-part of international application No. PCT/JP2005/015415, filed Aug. 25, 2005, which are hereby incorporated herein by reference in their entirety.

TECHNICAL FIELD

The invention relates to control of access region a memory cell array in a storage device.

BACKGROUND

In a semiconductor device disclosed in Japanese Unexamined Patent Application Publication No 2001-325795 a memory cell array is composed of a plurality of cores, in which a memory cell range as a unit of erasing data is a block, and a set of one to a plurality of blocks is one core and a plurality of cores, are arranged. An arbitrary number of cores are selected by core selecting means, data is written into the selected memory cell in the core, and data is erased from the selected block in the core. During this period, data is read out in the memory cell in the core not selected. An arbitrary core is selected, and data is written or erased, and at the same time data can be, read out in other arbitrary core. The range of simultaneous operation is not limited, and a flash memory of high degree of freedom is realized.

In this case, an address signal is given from outside by an address input circuit in the interface circuit, and supplied into an address buffer circuit. From the address buffer circuit, depending on the operation mode, the address is supplied to the address bus line for reading address, or address bus line for writing or erasing, and is selectively transferred to a decoding circuit of each decoding circuit of each core.

Japanese Unexamined Patent Application Publication No, 2001-325795 enables to set the bank size, supposing the range of an arbitrarily determined core to be one bank, when executing simultaneously a data writing or an erasing operation and a data reading operation. The data quantity demanded from the system varies in each access operation, and the memory cell region depending on the demanded data quantity can be specified as the object of access.

In Japanese Unexamined Patent Application Publication No, 2001-325795, however, regardless of difference in the access operation, such as data writing, erasing, and data reading, the access object of each access operation is applied to all memory cell arrays. On every occasion of the access operation, all address signals must be entered from outside. On the other hand, in the access operation accompanied by input and output of data such as the reading operation and the writing operation, the data quantity demanded in a series of access operation may be estimated within a range of specified quantity, and the memory cell region of the object of access can be stored in the specified region. However, in Japanese Unexamined Patent Application Publication No 2001-325795, when accessing the region of the same memory cell, although the higher address signal for specifying the memory cell region is unchanged, the signal is entered from outside on every occasion of access, and decoding process or the like is executed. Unnecessary input process of address signal must be done on every occasion of the access operation, and the input process of address signal is merely frequent.

In particular, as the storage device is increased in capacity, even a memory cell region forming part of the memory cell array may be equivalent to a memory capacity capable of storing sufficiently the data quantity demanded by the system, in such a case, it is a useless deed to enter constant higher address signal on every occasion of the access operation. By this circuit operation. By this circuit operation, limitations may occur in shortening of processing time and saving of current consumption or the like.

Further, due to increase in capacity of storage device, the address space for composing the memory cell array become wider, and the address signal is composed of multiple bits, and the address decoder in the storage device consists of multiple inputs and multiple logical stages. The address signal is decoded by the address decoder, and the memory cell as an object of access in the memory cell array is determined. If the setting time by the address decoder is delayed because of multiple inputs and multiple logical stages, problems occur that determination of the memory cell is delayed, and the memory cell access is retarded. Consequently, in response to the increase in the number of input terminals of the address signal in storage device and increase in control quantity by the memory controller, it is required to establish an efficient input interface technology of the address signal, and the high speed operation of the address decoder consisting of multiple inputs and multiple logical stages.

SUMMARY

This Summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The invention is conceived in the light of the above background art, and it is hence an object thereof to present a storage device capable of controlling the access region efficiently and processing the address decoder at high speed, in the reading operation and/or the writing operation, by assigning the memory cell region suited to the data quantity required in a series of the access operation, in part of the memory cell regions to be erased in hatch by the erase operation, and by skipping re-input of the address signal for designating the memory cell region, while accessing the same memory cell region in continued reading operation and/or writing operation, and a control method of such storage device.

In order to achieve the above object, according to the present invention, there is provided a storage device comprising:

a memory cell array comprised of a plurality of sectors each of which is a memory cell region being one unit of an erase operation; and an address holding section holding the first address signal which defines a unit of said read operation and/or said write operation as partial region in said sector when start of read operation and/or write operation.

In the storage device of the invention, a partial region in the sector of erasing operation unit is specified by a first address signal upon start of the reading operation and/or the writing operation, and is used as the unit of the reading operation and/or the writing operation. The first address signal is held in the address holding unit.

in addition, there is provided a control method of a storage device which comprises a memory cell array comprised of a plurality of sectors each of each of which is a memory dell region being one unit of an erase operation, the control method comprising the steps of inputting a first address signal which selects a partial region when a readout operation and/or a write operation starts, the partial region being defined as one unit of access; and holding the inputted first address signal during the readout operation and/or the write operation of the partial region.

In the control method of storage device of the invention, a partial region in the sector of the erasing operation unit is used as an access unit, and when the reading operation and/or the writing operation is started, a first address signal is entered, and the partial region is selected. The entered first address signal is held during the period of the reading operation and/or the writing operation into the partial region, and part of process by the address decoder is executed at high speed by the preliminarily held first address signal.

In the memory system and its control method of the invention, the storage control device for, controlling access to the storage device stores the first address signal in the storage device when the first address signal is supplied once when starting the reading operation or the writing operation. Afterwards, the storage control device issues a second address showing the memory cell position in the partial region, and the storage device receives the second address signal, and issues the data information of the memory cell in the partial region. The input of the second address signal is preferred to be continuous.

Accordingly, upon start of the reading operation and/or the writing operation, since the first address signal is held, it is not required to enter the first address signal again when the reading operation and/or the writing operation is continuous in the same partial region.

Hence, in the access operation executed continuously in the same, partial region the first address signal can be maintained in decoded state, and and the decoding operation in each access operation is not needed. As the decoding operation in each access operation, it can be executed only in the address signal for specifying the memory cell disposed in the partial region in the sector, and the decoded state can be established earlier. At the time of the reading operation or the writing operation, bias can be applied earlier, which can contribute to enhancement of access speed.

When the access operation is continuous in the same partial region, it is not necessary to enter the first address signal or decode the first address signal on every occasion of the access operation. Unnecessary circuit operations can be prevented, and the current consumption can be saved.

Further, in the controller for access control of the storage device, when starting the reading operation and/or the writing operation, by supplying the first address signal only once, the first address signal is held in the storage device thereafter, and the controller is released from the control of the first address signal. Hence, the control toad on the controller can be reduced.

BRIEF DESCRIPTION OF THE DRAWINGS

FIG. 10 illustrates an exemplary digital camera, in accordance with an embodiment of the present claimed subject matter.

DETAILED DESCRIPTION

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it be evident to one of ordinary skill in the art that the present claimed subject matter may be practiced without these specific details. In other instances, well known methods, procedures, components, and circuits have not been described in detail as not to unnecessarily obscure aspects of the claimed subject matter.

An exemplary embodiment of a storage device and a control method of the storage device of the invention are specifically described below while referring to FIG. 1 to FIG. 6.

Figure 1:
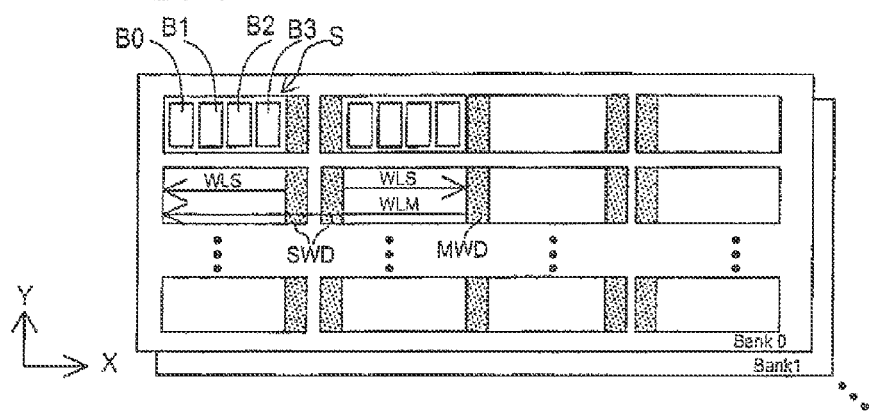
FIG. 1 is a diagram of sectors for partitioning a memory cell array, and block for partitioning a sector in a storage device, in accordance with an embodiment of the present claimed subject matter.

FIG. 1 is a schematic diagram of partition of a memory cell array in a storage device. A plurality of banks (Bank0, Bank1, . . . ) are provided individually for access control independently. Each bank has a plurality of sectors S as erasing operation units. Each sector is divided into four sections in the X-direction or the word line direction; and is divided into four blocks B0 to B3 as units of the reading operation and/or the writing operation.

In FIG. 1, the X-direction is the word line direction, and a hierarchical word line structure is shown. Each sector S has a subword decoder SWD, and a subword line WLS is commonly wired to four blocks B0 to B3. Further in B0 to B3. Further in every two sectors 8, a main word decoder MWD is provided, and a main word line is wired to two sectors. Four blocks B0 to B3 are divided by the specified number of bit wires (not shown) wired in the Y-direction, and a common subword line WLS is wires in the blocks in the same sector. Hence, each block does not need own word line, and each block does not need own word decoder, word line driver, or a control circuit of the word line. Hence, the memory cell can be disposed at minimum disposing pitches among blocks.

Figure 2:
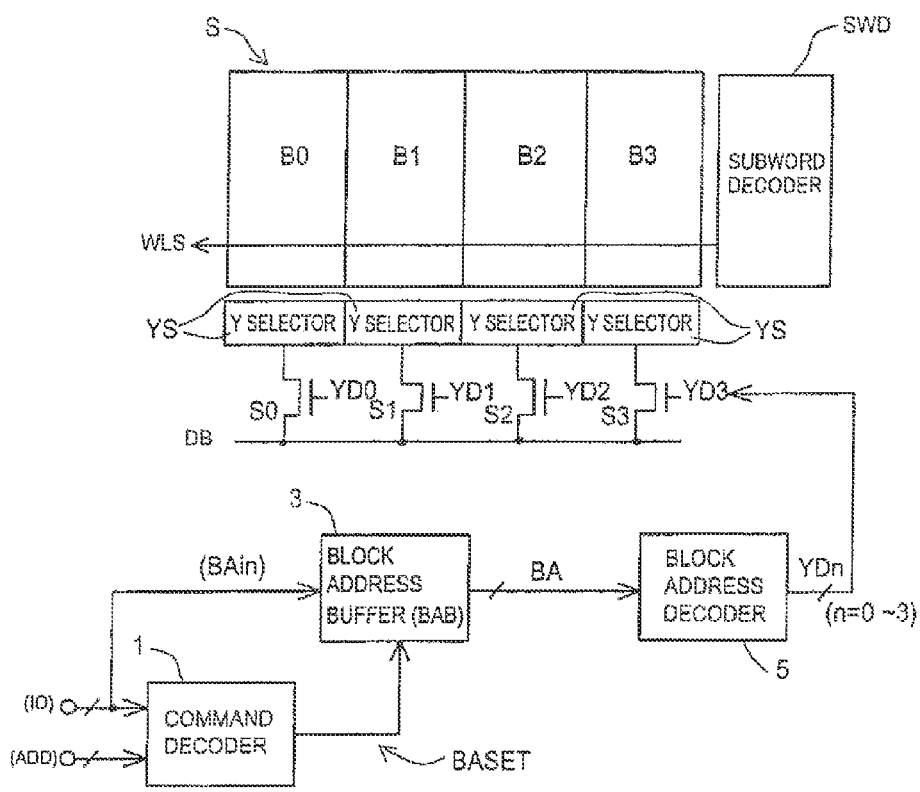
FIG. 2 is a circuit block diagram of block selection, in accordance with an embodiment of the present claimed subject matter.

FIG. 2 shows selection control of block. Four blocks B0 to B3 in sector S are selected by selection of bit line (not shown) disposed in the Y-direction. Bit lines of blocks B0 to B3 are connected to data lines DB by way of Y selector YS and block selection switches S0 to S3. The Y selector YS is a switch group for selecting plural bit lines disposed in the block by a selector decoder (not shown).

Any one of selection signals YD0 to YD3 of block selection S0 to S3 is selected in the reading operation and/or the writing operation. Although not shown in the diagram, in an erasing operation, by selecting al required, the sectors S can be erased in batch.

Selection signals YD0 to YD3 are entered by the command cycle described below prior to the reading operation and/or the writing operation, and selected according to the block address BA held in the internal block address buffer (BAB) 3.

In the command cycle, a command is entered from a data input and output terminal (IO) and/or the address terminal (ADD). The entered data is decoded by the decoder 1 connected to the data input and output terminal (IO) and/or address terminal (ADD). In the command cycle, for example, when input of a block address BA, from the data input and output terminal (IO) is decoded, the command decoder 1 issues a block address set signal BASET to the block address buffer (BAB) 3. As the block address buffer (BAB) 3 connected to the data input and output terminal (IO) receives the block (IO) receives the block address set signal BASET, the block address buffer (BAB) 3 holds the block address BAin entered from the data input and output terminal (IO) in its inside. The block address BA held in the block address buffer (BAB) 3 is held unto it is rewritten in the command cycle. The held block address BA is decoded by the block address decoder 5, and any one of selection signals YDn (n=0 to 3) is decoded and issued as a selection signal. The selection signal issued from the block address decoder 5 is not changed until the block address BA held in the block address buffer (BAB) 3 is rewritten by the command cycle.

Hence, depending on the held block address BA, any one of the selection switches S0 to 53 is selected, and any block in the sector S is selected as, the object of the reading operation and/or the writing operation. This selection is maintained until the block address BA held in the block address buffer (BAB) 3 is rewritten by the command cycle.

Figure 3:
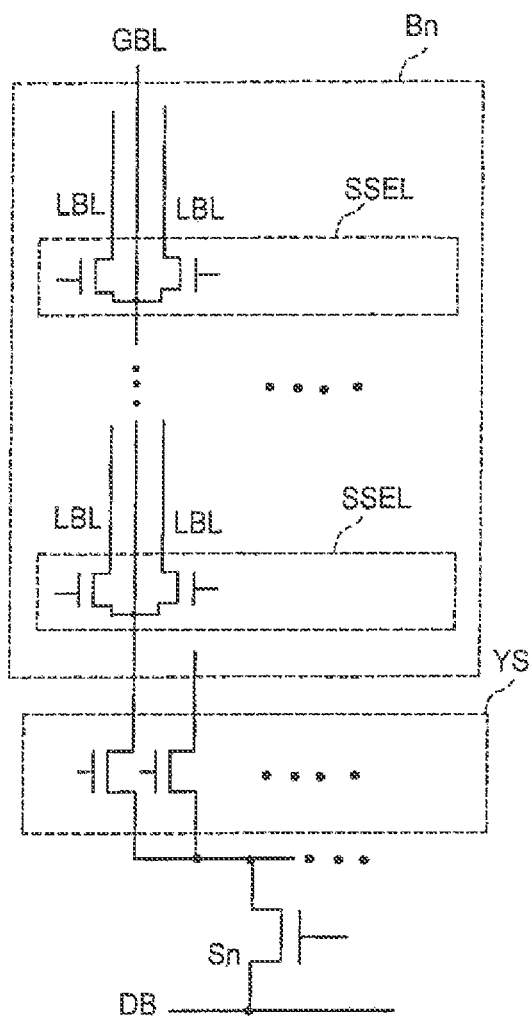
FIG. 3 is a diagram of bit line structure, in a block, in accordance with en embodiment of the present claimed subject matter.

FIG. 3 shows the composition of data input and output route from the bit line in the block up to the data line DB. In FIG. 3, a hierarchical structure is explained as an example of bit line structure, A block Bn has a plurality of global bit lines GBL, and each global bit line GBL is connected to a plurality of local bit lines. LBL by way of a plurality of select switches SSEL. A plurality of memory cells are connected to each local bit line LBL. The plurality of global big lines GBL in the block are connected to the block selection switch Sn by way of Y selector VS, and further connected to data line DB.

Suppose the storage device to be a nonvolatile storage device. In the program operation for writing data, in the block selected as the object of the program operation, a high bias voltage is applied for a predetermined time only in the local bit line LBL and global bit line GBL to which the memory cell as object of program is connected. On the other hand, in other local bit line LBL connected to the same global bit line GBL, to which memory cell not object of a program is connected, being controlled to floating state or controlled to floating state or grounding potential state, it is required that bias voltage should not be applied to memory cell. Further, in global bit line GBL not selected as object of program operation in a block selected as the object of the program operation and a plurality of local bit lines LBL connected to its global it line GBL, it is required that bias voltage should not be applied to memory cell, by controlling to floating state or grounding potential state, etc. In the bit lines not selected as the object of program operation, similarly, the floating state or grounding potential state is important. Between blocks B0 to B3, a common subword WLS is wired, a high bias voltage is applied to the memory cell in the block not the object of the program operation, by way of subword line WLS, because it is necessary to prevent disturbing phenomenon due to local bit line LBL and subword line WLS in these memory cells.

In the program operation when the route to local bit line LBL is established, selection of a select switch SSEL, an V selector YS, and a block select switch Sn is completed, and then supply of bias voltage for the program operation into data line DB must be selected. The bias voltage supplied to the data line DB is a higher voltage (for example, 9 V) than the supply voltage (for example, 1.8 V). To supply this high bias voltage to the local bit line LBL by way of the select switch SSEL, Y selector YS, and block select switch Sn, for example, the voltage to be applied to gate terminals of the select switch SSEL, the V selector VS, and the block select switch Sn composed of N channel transistors must be high voltage higher than the high voltage signals further by the portion of threshold of a transistor. Since the voltage amplitude applied to the gate terminals is larger, the transition time as rise and fail time of high voltage signal may cause to limit shortening of access time in the program operation. Therefore, in the program operation, by fixing the memory cell region of the object of the program in the block and holding the block address BA in the block address buffer (BAB) 3 preliminarily, the decoding operation operation by the block address decoder 5 can be executed in advance, and the selection signal YDn can be fixed. By preliminarily selecting the block selection switch Sn as one of the switch group to apply the high voltage signal to the gate terminal, the high voltage signal can be applied to the gate terminal in advance. Transition time of high voltage signal to the gate terminal can be shortened. It is not necessary to transfer the high voltage signal in every program operation, so that the current consumption can be saved.

In the reading operation, too, for example, in continuous reading operation such as burst reading, the reading cycle is short (for example, 10 nsec), and by the precharge circuit for applying to the it line for the reading operation connected to the data line DB, it is required to advance supply start of bias voltage for the reading operation. The block address BA is held and the decoding operation is done preliminarily, so that the selection signal YDn can be fixed. By preliminarily selecting the block selection switch Sn as one of the switch group for applying high voltage signal (5 V) to the gate terminal, the high voltage signal can be applied to the gate terminal in advance. Hence, supply start of bias voltage for the reading operation can be advanced, and in high speed and continuous reading operation such as the burst operation, the access speed including fast access can be assured securely.

Figures 4, 5:
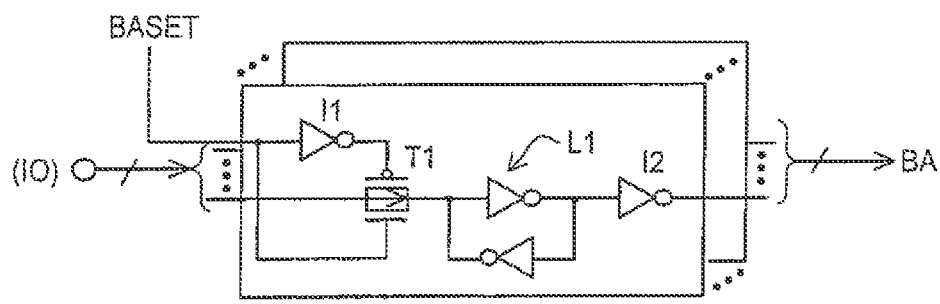
FIG. 4 is a diagram showing a command when setting a block address, in accordance with an embodiment of the present claimed subject ma ter.
FIG. 5 is a circuit diagram of a block address buffer, in accordance with an embodiment of the present claimed subject matter.

FIG. 4 is a diagram showing a command system for setting the block address BA. In the command cycle prior to the reading operation and/or the writing operation in the individual memory cells, this is a command for setting the block as the object of access in the series of the access operation described below. Command and block address BA in are entered depending on the combination of signals entered from address terminal (ADD) and data input and output terminal (IO).

First, as entry command, a signal set of three cycles is entered. In first cycle, a code of 555h from address terminal (ADD) and a code of AAh from from data input and output terminal (IO) are entered. In second cycle, a code of 2AAh from the address terminal (ADD) and a code of 55h from the data input and output terminal (IO) are entered. In third cycle, a code of 555h from the address terminal (ADD) and a code of 93h from the data input and output terminal (IO) are entered. Combination of these codes is decoded in a command decoder 1, and entry in a command cycle of the block address BAin is recognized.

Next, block address BAin is entered by write command. In first cycle, a code of XXh is received from the address terminal (ADD) and a code of A0h from the data input and output terminal (IO), and in a second cycle, a code of 00h is received from the address terminal (ADD) and the block address BAin from the data input and output terminal (IO). As a result, in the command decoder 1, in the second cycle, the signal entered from the data input and output terminal (IO) is recognized as the block address BAin, and a trigger signal BASET is issued for take in the block address BAin into the block address buffer (BAB) 3.

Further, the exit command is discussed. In first cycle, code of XXh is entered from the address terminal (ADD) and a code of 90h from the data input and output terminal (IO), and in the second cycle, a code of XXh is received from the address terminal (ADD) and a code of 00h from the data input and output terminal (IO). Combination of these codes is decoded in the of and decoder 1, and it is recognized to be away from the command cycle of the block address BAin.

FIG. 5 is a circuit example of storing one bit of the block address buffer (BAB) 3. By the trigger signal BASET and the inversion signal by the inverter gate 11, transfer gate T1 is controlled to conduct. The transfer gate T1 is connected between the data input and output terminal (IO) and a latch circuit L1. The output of the latch circuit L1 is issued as the block address BA by way of an inverter gate I2.

Depending on the high level trigger signal BASET, the transfer gate T1 T1 conducts, and the block address BAIT entered in the gate input and output terminal (IO) is taken into the latch circuit L1. In the subsequent access operation, since the trigger signal BASET is maintained at low level, the content of the latch circuit L1 is held, and the output state of the block address BA is maintained through the inverter gate I2. The block address BA information of the latch circuit L1 is maintained until next input of entry command/write command.

Figure 6:
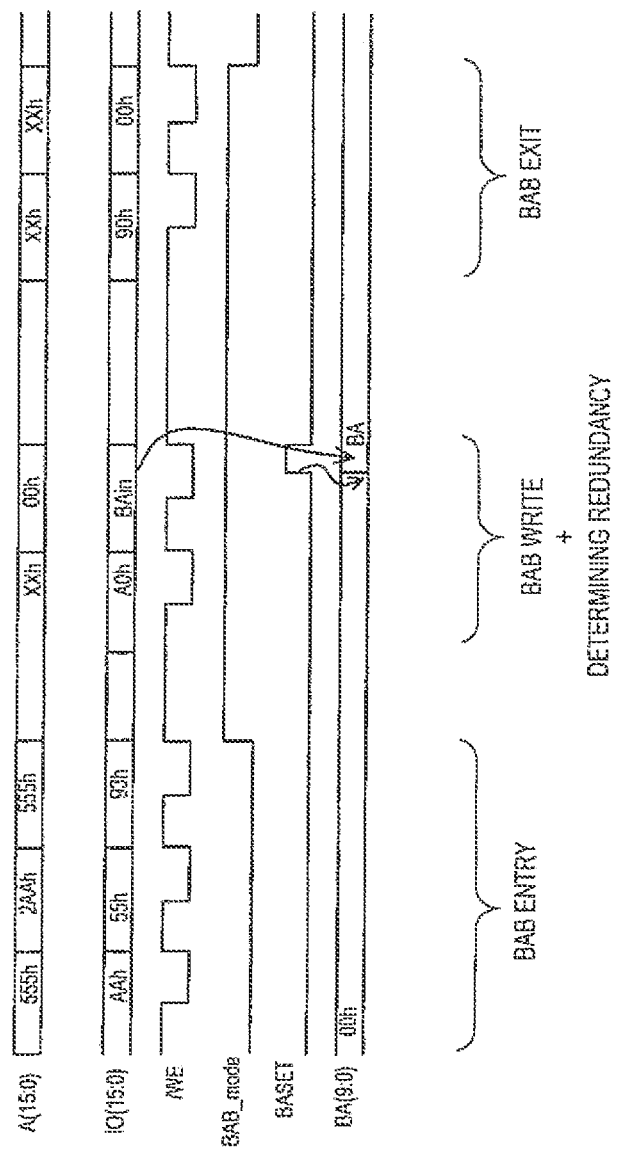
FIG. 6 is a timing chart of setting a block address, accordance with an embodiment of the present claimed subject matter.

FIG. 6 is a timing chart of a command cycle for setting the block address BA. The command codes explained in FIG. 4 are issued in synchronism with write enable signal /WE low level signal. The entry command is decoded by the command decoder 1, and the block address mode signal BAB_mode is changed to high level. It is informed that the block, address is in set command state. Next, the write command of the block address BAin of two cycles is issued in synchronism with a write enable signal /WE low level signal. The write command is decoded by the command decoder 1, and the trigger signal BASET is issued as a high level pulse signal. The block address BAin entered in the data input terminal (IO) is taken into the block address buffer (BAB) 3, and the block address BA is held. After the block address BA is held, an exit command of two cycles is issued in synchronism with the write enable signal /WE low level signal. The exit command is decoded by the command decoder 1, and the block address set mode BAB_mode is changed to low level. This ends the set command state of block address.

As clear from the above description, according to the embodiment, along with start of the reading operation and/or the writing operation, the block address BA as an example of the first address signal is held in the block address buffer (BAB) 3 as an example of an address holding unit, it is not required to enter the block address BA again, when the reading operation and/or the writing operation continues in a same partial region or any one of blocks (blocks B0 to B3).

Accordingly, in the access operation continuing in the same block, selection state of one selection signal (any one of YD0 to YD3) is maintained. The decoded state of the block address BA is maintained, and the decoding operation in each access operation is not needed. As decoding operation in each access operation, it is enough to decode the select switch SSEL or the Y selector VS depending on the address signal for selecting individual memory cells in the block. The decoded state can be established early. Bias can be applied early at the time of the reading operation or the writing operation, which contributes to enhancement of access speed.

In addition, when the access operation continues in the same block, it is not required to enter the block address BA or decode it on every occasion of the access operation. Unnecessary circuit operations can be prevented, and current consumption can be saved.

Further, in case of the controller or access control of the storage device, once the block address BA is supplied upon start of the reading operation or the writing operation, and afterwards the block address BA is held in the storage device, and it is free from control of the block address BA. As a result, the control load in the controller can be reduced.

The invention is not limited to this embodiment alone, but may be changed and modified within the scope not departing from the true spirit of the invention.

For example, in the embodiment, the sector S is divided into four blacks, and the reading operation and/or the writing operation is executed, but the invention is not limited this operation. Depending on the application of use of the storage device, the memory cell region to be accessed in a series of the reading operation or the writing operation may be different. Block divisions in the sector are preferred to be divided into proper divisions of appropriate memory capacity depending on the application.

Further, block selection switches S0 to S3 may be formed various connection configurations depending on the number of block divisions in the sector. For example, the plurality of Y selectors may be grouped to assign one block selection switch, and the Y selector hierarchical structure may be composed for assigning one selector out of a plurality of V selectors in the group, or a plurality of blocks may be grouped to assign one data line DB, and data line hierarchical structure may be composed for assigning one selector out of data lines DB in each (Hour).

The bit line structure of the invention is not limited to the example in FIG. 3. The connection method at the memory cell to be connected to the local bit line LBL may also include the so-called NOR type connection and NAND type connection. The program system erasing system may be also applied in nonvolatile program/erasing system making use of various physical actions.

Embodiments of the present claimed subject matter generally relates to semiconductor devices. More particularly, embodiments allow semiconductor devices to function with increased efficiency. In one implementation, the claimed subject matter is applicable to flesh memory and devices that utilize flash memory. Flash memory is a form of non-volatile memory that can be electrically erased and reprogrammed. As such, flash memory, in general is, a type of electrically erasable programmable read only memory (EEPROM).

Like Electrically Erasable Programmable Read Only Memory EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones).

Flash memory stores information in an array of floating gate transistors, called "cells", each of which traditionally stores one bit of information. However, newer flash memory devices, such as MirrorBit Flash Technology from Spansion Inc., can store more than bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 7:
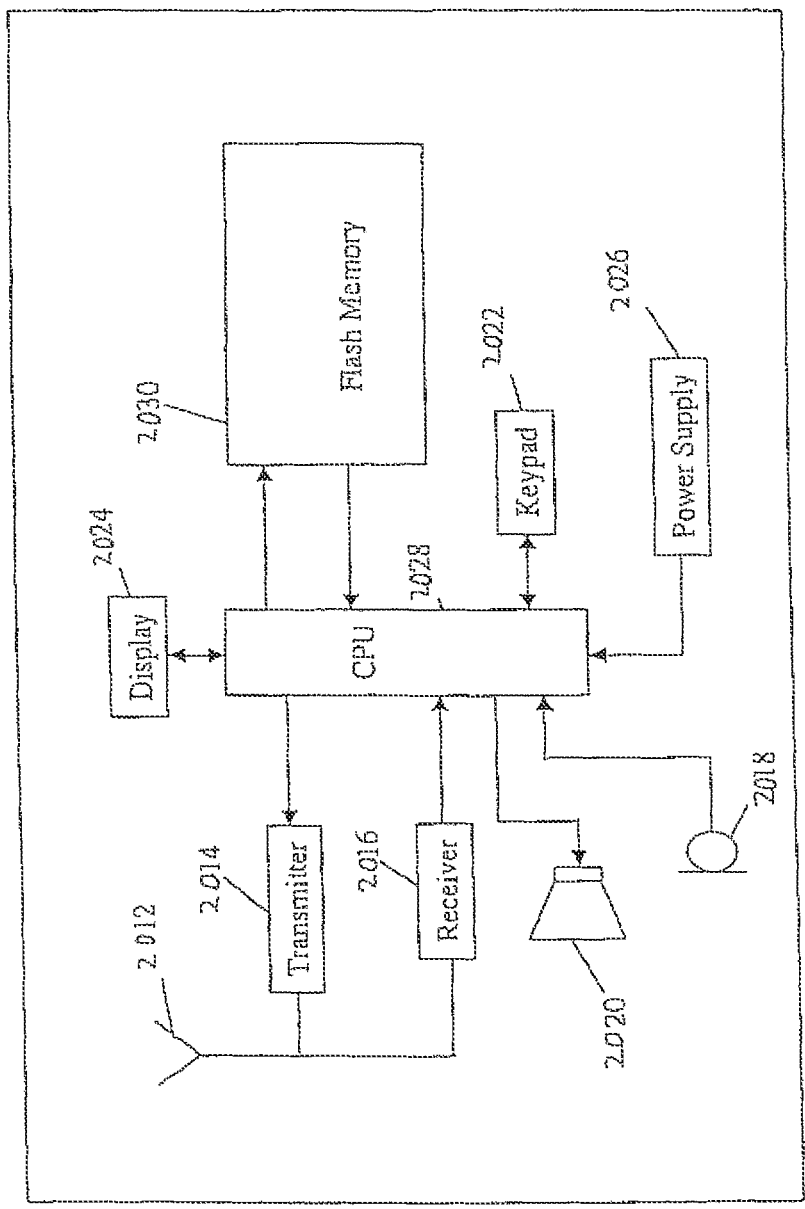
FIG. 7 illustrates a block diagram of a conventional portable phone, upon which embodiments can be implemented.

FIG. 7 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016 as well as a microphone 2018, speaker 2020, keypad 2022, and display 2024, the cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: a memory cell array comprised of a plurality of sectors each of which is a memory cell region being one unit of an erase operation; and an address holding section holding the first address signal which defines a unit of said read operation and/or said write operation as partial region in s sector w start of read operation and/or write operation.

Embodiments prevent unnecessary circuit operations and save current consumption. Also, embodiments reduce the control load on a controller. Furthermore, embodiments enhance access speed. These improvements in flash memory translate into performance improvements in various devices, such as personal digital assistants; set-top boxes, digital video recorders, networking and telecommunication equipments, printers, computer peripherals, automotive navigation devices, gaming systems, mobile phones, cellular phones, Internet protocol phones, and/or wireless phones.

Flash memory cones in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be zed in personal digital assistants, set-top boxes, digital video recorders, networking and telecommunication equipments, printers, computer peripherals, automotive navigation devices, and gaming systems.

Figure 8:
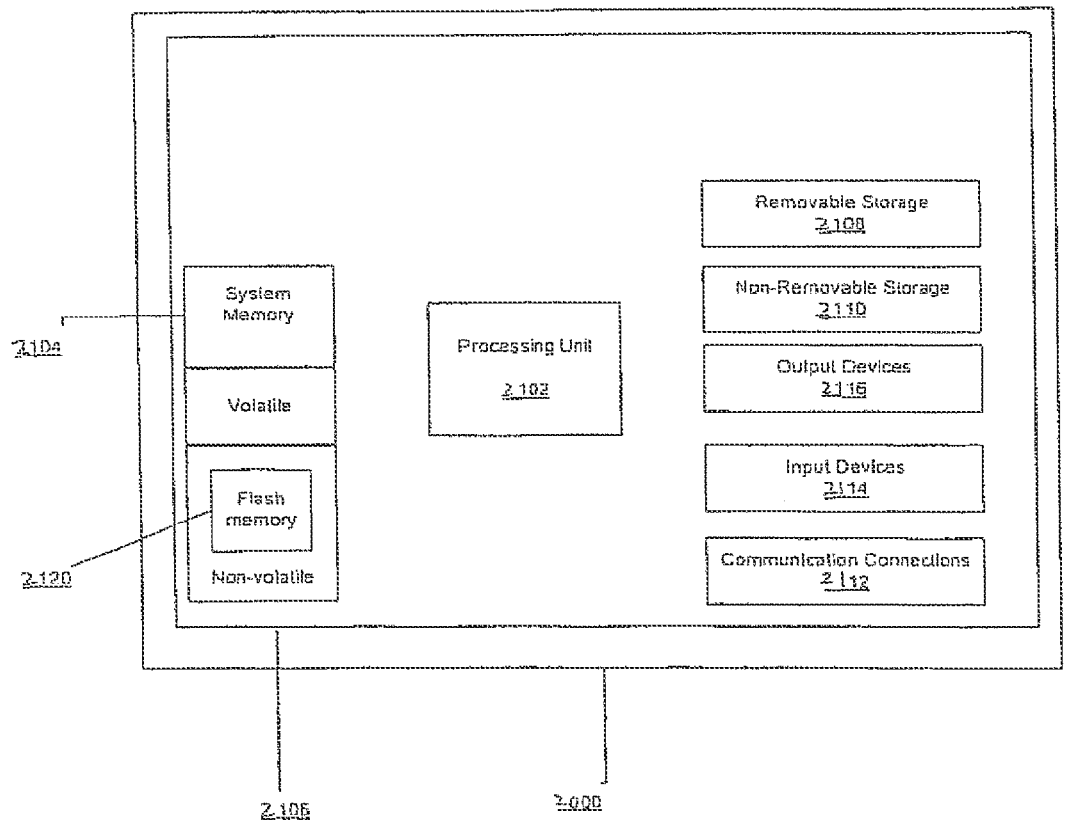
FIG. 8 illustrates a block diagram of a computing device, upon which embodiments of the present claimed subject matter can be implemented.

FIG. 8 illustrates a block diagram of a computing device 2100, upon which embodiments of the present claimed subject matter can be implemented. Although computing device 2100 is shown and described in FIG. 3 as having certain numbers and types of elements, the embodiments are not necessarily limited to the exemplary implementation. That is, computing device 2100 can include elements other than those shown, and can include more than one of shown, and can include more than one of the elements that are shown. For example, computing device 2100 can include a greater number of processing units than the one (processing unit 2102) shown. Similarly, in another example, computing device 2100 can include additional components not shown in FIG. 8.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts.

Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 8 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized, to receive different game cartridges. In another example, in the context of a Digital Video Disc (DVD) recorder, the removable Disc (DVD) recorder, the removable storage is a DVD receiving component utilized to receive and read DVDs. Such additional storage is illustrated in FIG. 8 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical stooge, magnetic cassettes, magnetic tape, magnetic disk storage or other magnetic storage devices, or any other medium which can be used to store the desired information and which can accessed by device 2100. Any such computer storage media may be part of device 210.

In the present embodiment, the flash memory 2120 comprises: a memory cell array comprised of a plurality of sectors each of which is a memory cell region being one unit of an erase operation; and an address holding section holding the first address signal which defines a unit of said read operation and/or said write operation as partial region in said sector when start of read operation and/or write operation.

Embodiments prevent unnecessary circuit operations and save current consumption. Also, embodiments reduce the control load on a controller. Furthermore, embodiments enhance access speed. These improvements in flash memory translate into performance improvements in various devices, such as personal digital assistants, set-top boxes, digital video recorders, networking and telecommunication equipments, printers, computer peripheral automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides or a memory cell.

Device 2100 may also contain communications connection(s) 211 that allow the device to communicate with other devices. Communications connections) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a mariner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g. a joy stick, a game control pad, sand/or other types of game input device), touch input device, etc. Output device(s) 2116 such as a display (e.g., a computer monitor and/or projection system), speakers, printer, network peripherals, etc., may also be included. All these devices are well know in the art and need net be discussed at length here.

Aside from mobile phones and portable computing devices, flash memory is also widely used in portable multimedia devices, such as portable music players. As users would desire a portable multimedia device to have as are a storage capacity as possible, an increase in memory density would be advantageous. Also, users would also benefit from reduced memory read time.

Figure 9:
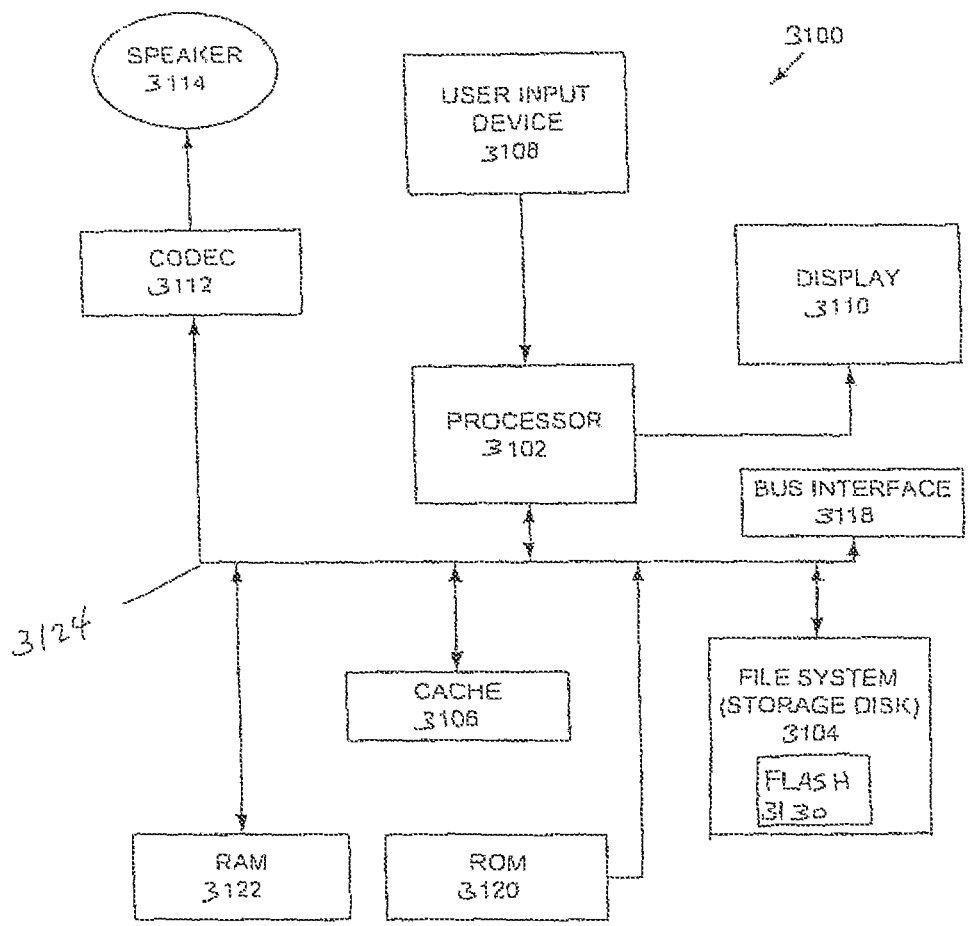
FIG. 9 illustrates an exemplary portable multimedia device, or media player, in accordance with an embodiment of the present claimed subject matter.

FIG. 9 shows an exemplary portable multimedia device, sir media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a memory cell array comprised of a plurality of sectors each of which is a memory cell region being one unit of an erase operation; and an address holding section holding the first address signal which defines a unit of said read operation and/or said write operation as partial region in said sector when start of read operation and/or write operation.

Embodiments prevent unnecessary circuit operations and save current consumption. Also embodiments reduce the control load on a controller. Furthermore, embodiments enhance access speed. These improvements in flash memory translate into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the fife system 3104 is relatively slow, the media player 3100 can also include a cache 3106. The cache 3106 is for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input, device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are armed in a hierarchical manner based upon a selected number and type of type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets or in this case, songs) can be grouped in any manner, deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Referring to FIG. 10 the internal configuration of a digital camera 3001 is described. FIG. 10 is a block diagram showing the internal functions of the digital camera 3001. The COD (image capturing device) 3070 functions as image capturing means for capturing a subject image and generating an electronic image signal and has, for example, 1600 times 1200 pixels. The COD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the COD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image, signal by performing a process of reducing noise in the image signal by the correlated double sampling circuit and adjusting the gain by the automatic gain control circuit.

An A/D converter 3022 converts each of pixel signal of the image signal into a digital signal of 12 bits. The digital signal obtained by the conversion is temporarily stored as image data in a buffer memory 3054 in a RAM 3050a. The image data stored in the buffer memory 3054 is subjected to WB (white balance) process, gamma correction process, color correction process and the like by an image processing unit 3051 and, after that the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050a and a ROM 3050b. When the microcomputer executes a predetermined program, the overall control unit 3050 functions as a controller for controlling the above-described components in a centralized manner. The overall control unit 3060 also controls, for example, a live view display process and a process of recording date to a memory card. The RAM 3050a is a semiconductor memory (such as DRAM) which can be accessed at high speed and the ROM 3050b takes the form of, for example, an electrically-writable nonvolatile semiconductor memory (such as flash ROM 3050c). A flash memory, in one embodiment, includes: a memory cell array comprised of a plurality of sectors each of which is a memory cell region being one unit of plurality of sectors each of which is a memory cell region being one unit of an erase operation; and an address holding section holding the first address signal which defines a unit of said read operation and/or said write operation as partial region in said sector when start of read operation and/or write operation.

Embodiments prevent unnecessary circuit operations and save current consumption. Also embodiments reduce the control load on a controller. Furthermore, embodiments enhance access speed. These improvements in flash memory translate into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050a functions as a buffer area for temporary storing, data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 305 is a processing unit for performing various digital imaging processes such as WB process and gamma correcting process. The WS process is a process of shifting the level of each of the color components of R, G and 6 and adjusting color balance. The gamma correcting process is a process of correcting the tone of pixel data. The compressing/decompressing unit 3052 is a processing unit for performing an image data compressing process and an image data decompressing process, decompressing process. As the compressing method, for example, the JPEG method is employed. The sound processing unit 3053 is a processing unit for performing venous digital processes on sound data.

A card interface (I/F) 3060 is an interface for writing/reading image data to/from the memory card 3090 inserted into the insertion port in the side face of the digital camera 1. At the time of reading/writing image data from/to the memory card 3080, the process of compressing or decompressing image data is performed according to, for example, the JPEG method in the compressing/decompressing unit 3052, and image data is transmitted/received between the buffer memory 3054 and the memory card 3093 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050*a* or ROM 3050*b* of the overall control unit 3050. In such a manner, the control program can be updated.

Also by communication with an external device (such as an external computer) via a USB terminal, various data such as an image and sound and a control program can be transmitted/received. For example, venous data, a program, and the like recorded on a recording medium (CD-R/RW or CD-ROM) which is set into a reader (optical drive device or the like) of the external computer can be obtained via the USB terminal.

What is claimed is:

1. A control method of a storage device which comprises a memory cell array comprised of a plurality of sectors each of which is a memory cell region that is associated as a unit with an erase operation, the control method comprising:

inputting a first address signal which selects a partial region of a plurality of partial regions when a readout operation and a write operation starts, the partial region being defined as one unit of access wherein the partial regions are identified based on the quantity of data involved in an access;

holding the inputted first address signal during the readout operation and the write operation of the partial region, wherein the partial region comprises a plurality of data readout lines which are placed in the sector and partitioned; and retaining the plurality of the data readout lines in a selected state during the readout operation and/or the write operation depending on the held first address signal.

2. The control method of the storage device of claim 1, further comprising commonly selecting a memory cell selection line which intersects with the data readout lines in the sector regardless of the first address signal.

3. The control method of the storage device of claim 1, further comprising the steps of:

inputting an operating condition prior to the readout operation and/or the write operation, including inputting the first address signal; and inputting a second address signal representing a position of a memory cell in the partial region after inputting the operating condition.

4. The control method of the storage device of claim 3, wherein the step of inputting the operating condition includes:

instructing an entry; and instructing input of the first address signal.

5. The control method of the storage device of claim 3, further comprising:

issuing a specified command cycle setting the first address signal prior to a command cycle which performs the readout operation and/or the write operation.

\* \* \* \* \*